US012679999B2

(12) United States Patent
Kim et al.

(10) Patent No.: US 12,679,999 B2
(45) Date of Patent: Jul. 14, 2026

(54) SLURRY COMPOSITION FOR FINAL POLISHING OF SILICON WAFER FOR REDUCING NUMBER OF SURFACE DEFECTS AND HAZE AND FINAL POLISHING METHOD USING SAME

(71) Applicant: YCCHEM CO., LTD, Gyeongsangbuk-do (KR)

(72) Inventors: Jun Han Kim, Daegu (KR); Seung Hun Lee, Daegu (KR); Seung Hyun Lee, Daegu (KR)

(73) Assignee: YCCHEM CO., LTD, Gyeongsangbuk-Do (KR)

( * ) Notice: Subject to any disclaimer, the term of this patent is extended or adjusted under 35 U.S.C. 154(b) by 140 days.

(21) Appl. No.: 18/574,734

(22) PCT Filed: Jun. 8, 2022

(86) PCT No.: PCT/KR2022/008078

§ 371 (c)(1),
(2) Date: Dec. 27, 2023

(87) PCT Pub. No.: WO2023/282475

PCT Pub. Date: Jan. 12, 2023

(65) Prior Publication Data

US 2025/0129266 A1 Apr. 24, 2025

(30) Foreign Application Priority Data

Jul. 8, 2021 (KR) ........................ 10-2021-0089599

(51) Int. Cl.

| | |
|---|---|
| ***C09G 1/02*** | (2006.01) |
| ***C09K 3/14*** | (2006.01) |
| ***H10P 52/40*** | (2026.01) |

(52) U.S. Cl.

CPC .............. *C09G 1/02* (2013.01); *C09K 3/1409* (2013.01); *H10P 52/402* (2026.01)

(58) Field of Classification Search

CPC .......... C09G 1/02; C09G 1/04; C09K 3/1409; C09K 3/1463; C09K 3/14;

(Continued)

(56) References Cited

U.S. PATENT DOCUMENTS

| | | | |
|---|---|---|---|
| 8,822,339 | B2 | 9/2014 | Shin et al. |
| 10,253,216 | B2 | 4/2019 | Stender et al. |

(Continued)

FOREIGN PATENT DOCUMENTS

| | | | |
|---|---|---|---|
| CN | 103740281 | A | 4/2014 |
| CN | 102648265 | B | 12/2014 |

(Continued)

OTHER PUBLICATIONS

JP-2001107089-A, Machine Translation. (Year: 2025).*

(Continued)

*Primary Examiner* — Binh X Tran
*Assistant Examiner* — Christopher Remavege
(74) *Attorney, Agent, or Firm* — NKL Law; Jae Youn Kim

(57) ABSTRACT

The present invention relates to: a slurry composition for final polishing of a silicon wafer, which reduces haze and the number of defects in the surface of an object to be polished and has excellent performance; and a final polishing method using same, the slurry composition comprising 1-20 wt % of colloidal silica as abrasive particles, 0.03-0.5 wt % of a surfactant, 0.1-10 wt % of a pH adjuster, 0.02-2 wt % of a water-soluble thickener, 0.05-0.2 wt % of a chelating agent, and 0.1-1 wt % of an organic base.

3 Claims, 3 Drawing Sheets

(58) Field of Classification Search
CPC ......... H01L 21/30625; H01L 21/02024; H01L 21/304; H01L 21/306; B24B 37/10
See application file for complete search history.

(56) References Cited

U.S. PATENT DOCUMENTS

| | | | |
|---|---|---|---|
| 10,273,383 B2 | | 4/2019 | Tsuchiya et al. |
| 2006/0196850 A1 | | 9/2006 | Roh et al. |
| 2012/0270399 A1 | | 10/2012 | Shin et al. |
| 2014/0051250 A1 | * | 2/2014 | Minami ................ B24B 37/044 438/693 |
| 2018/0002571 A1 | | 1/2018 | Stender et al. |
| 2018/0066161 A1 | | 3/2018 | Tsuchiya et al. |
| 2021/0087431 A1 | | 3/2021 | Liang et al. |
| 2021/0130739 A1 | * | 5/2021 | Kayakubo ............ C11D 3/2096 |
| 2022/0290008 A1 | * | 9/2022 | Goto ...................... C09K 23/00 |
| 2025/0129266 A1 | | 4/2025 | Kim et al. |

FOREIGN PATENT DOCUMENTS

| | | | | | |
|---|---|---|---|---|---|
| JP | 2001107089 | A | * | 4/2001 | |
| JP | 2008231159 | A | * | 10/2008 | |
| JP | 2010062434 | A | | 3/2010 | |
| JP | 2011079111 | A | * | 4/2011 | |
| JP | 2014151424 | A | | 8/2014 | |
| JP | 2017119781 | A | | 7/2017 | |
| JP | 2017222137 | A | | 12/2017 | |
| JP | 2018019075 | A | | 2/2018 | |
| KR | 20060097786 | A | * | 9/2006 | ............... C09G 1/02 |
| KR | 20110040721 | A | * | 4/2011 | ....... H01L 21/31053 |
| KR | 20170063563 | A | * | 6/2017 | ........... C09K 3/1409 |
| KR | 20170118690 | A | | 10/2017 | |
| KR | 102358134 | B1 | | 2/2022 | |
| TW | 201237130 | A | | 9/2012 | |
| TW | 202014510 | A | | 4/2020 | |
| WO | 2012036087 | A1 | | 3/2012 | |
| WO | 2016132676 | A1 | | 8/2016 | |
| WO | 2021049253 | A1 | | 3/2021 | |
| WO | 2021061510 | A1 | | 4/2021 | |

OTHER PUBLICATIONS

JP-2008231159-A, Machine Translation. (Year: 2025).*
JP-2011079111-A, Machine Translation. (Year: 2025).*
KR-20060097786-A, Machine Translation. (Year: 2025).*
KR-20110040721-A, Machine Translation. (Year: 2025).*
KR-20170063563-A, Machine Translation. (Year: 2025).*

* cited by examiner

SLURRY COMPOSITION FOR FINAL POLISHING OF SILICON WAFER FOR REDUCING NUMBER OF SURFACE DEFECTS AND HAZE AND FINAL POLISHING METHOD USING SAME

TECHNICAL FIELD

The present disclosure relates to an abrasive slurry composition for final polishing of silicon wafers while reducing defects and haze, and a final polishing method using the composition.

BACKGROUND ART

In general, silicon wafers, which are substrate for semiconductor manufacturing, are manufactured through processes such as single crystal growing, slicing, lapping, etching, polishing, and cleaning.

During the wafer manufacturing, polishing is a process for completely removing microscopic defects on the wafer surface, such as scratches, cracks, metal impurities, particles, light point defects (LPD), microroughness, etc. that are generated or not removed by all the processes starting with the growth of a silicon single crystalline ingot and ending with the final chemical mechanical polishing (CMP), whereby the polishing makes the wafer surface mirror-like.

The CMP process for wafers is a multi-stage process consisting of: stock removal polishing, which requires high polishing speeds to remove deep scratches on the wafer surface; and final polishing, which removes any remaining micro-scratches and reduces the microroughness of the surface (down to a few Å) to achieve a mirror-like surface.

The main causes determining the microscopic defects in the final polishing process are a hard or soft urethane abrasive pad and a silica slurry.

Typically, wafer slurries for final polishing contain colloidal silica as an abrasive, a pH regulator, an organic basic compound to promote polishing, a surfactant to improve dispersion stability and cleaning performance, a water-soluble thickener to improve particle stability and wafer surface protection, and a chelating agent that captures metal impurities that may be contained in the polishing slurry by forming complex ions with the metal impurities, thereby preventing polishing target objects from being contaminated by the metal impurities.

In recent years, as the tolerance for surface control on wafers has been reduced due to the increasing integration of semiconductor devices, active research and development has been conducted on polishing pads and slurries with suitable quality. In particular, since slurries are considered to be an important factor in determining the final quality of wafers, slurry products with various physicochemical properties have been introduced.

DISCLOSURE

Technical Problem

With the miniaturization of semiconductor wiring, it is needed to finish silicon substrates with a higher quality surface. For this reason, there is a demand for a final polishing slurry composition that can provide a silicon wafer substrate with reduced particulate and haze.

Accordingly, the present disclosure aims at improving the efficiency of a silicon wafer polishing process. The goal is accomplished by providing a high-performance silicon water final polishing composition that can reduce fine particles and haze on the surface of a silicon wafer substrate to be polished, and a final polishing method using the composition.

Technical Solution

The inventors of the present disclosure have searched for basic compounds and water-soluble polymers that can inhibit surface defects and reduce haze of silicon wafers after final polishing, have found that compositions comprising compounds having a certain structure have an excellent effect of reducing surface defects and haze of silicon wafers, and finally have made the present disclosure. In other words, the present disclosure aims to provide a composition for final polishing of a silicon wafer, the composition having an excellent effect of reducing surface defects and haze of silicon wafers.

To achieve the above objectives, the present disclosure provides a slurry composition for final polishing of silicon wafers, the slurry composition including ultrapure water, abrasive particles, a pH adjuster, a water-soluble thickener, and a chelating agent, wherein both a quaternary ammonium cation and a monofunctional methacrylate may be contained in the slurry composition.

In the present disclosure, the quaternary ammonium ion may be represented by Formula 1 shown below, and the monofunctional methacrylate may include a substance represented by Formula (2) shown below.

[Formula 1]

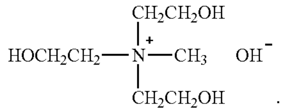

[Formula 2]

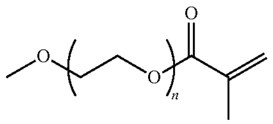

(In Formula 2 above, n is in a range of 7 to 22).

According to an embodiment of the present disclosure, in the slurry composition for final polishing, the particles may have an average particle diameter of 80 nm or less as measured using dynamic light scattering.

Generally, when the average particle diameter of the particles in a polishing composition is 80 nm or less, a surface to be polished becomes hydrophobic, resulting in increased surface defects and haze.

In addition, when the average particle diameter of the particles in the polishing composition is small, it is easy for the particles to reattach to the wafer surface after the completion of the polishing due to the electric double-layer attraction force, which may result in an increase in the number of defects.

However, in the case of using the polishing composition composed of the organic basic compound and the water-soluble polymer as described above, the ability to clean the surface of silicon wafers is improved even though the particles in the polishing composition are small, and the hydrophilic surface property of the wafers can be maintained. For this reason, according to one embodiment of the present disclosure, suppression of surface defects and reduction of haze on silicon wafers after polishing can be achieved.

Advantageous Effects

According to the present disclosure, the slurry composition for final polishing of silicon wafers has the remarkable effect of suppressing generation of fine particles and of reducing haze on the surface of silicon wafers while maintaining a polishing speed of higher than 40 nm/min, thereby contributing to great improvement in process reliability and productivity.

BEST MODE

Figure 1:
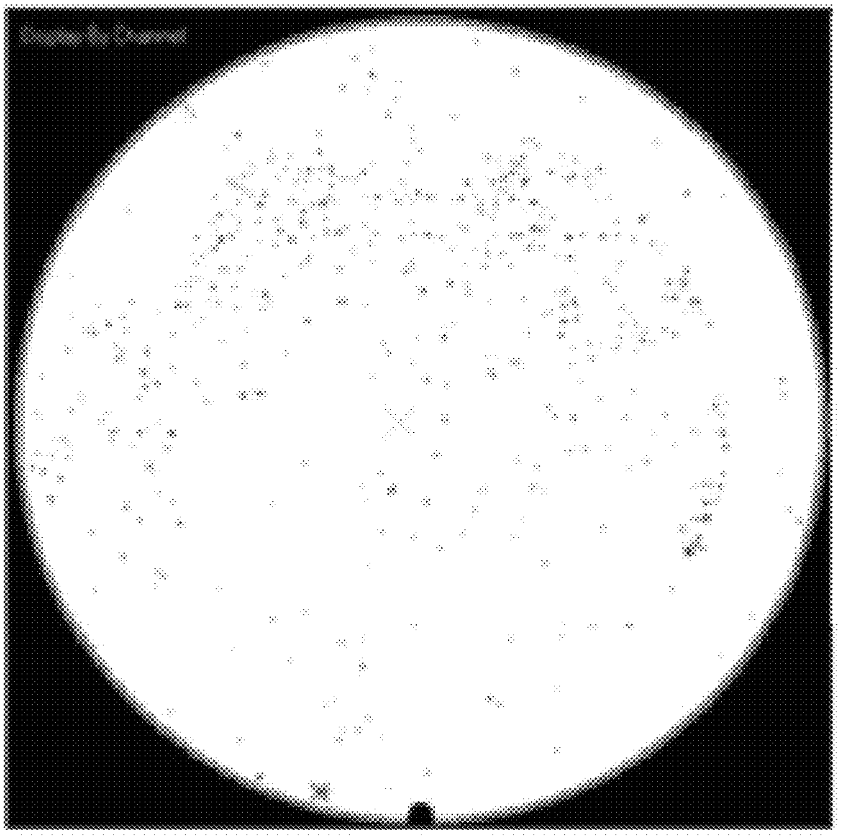
FIG. 1 is a surface defect map (MAP) of a silicon wafer according to Example 1 of the present disclosure.
Figure 2:
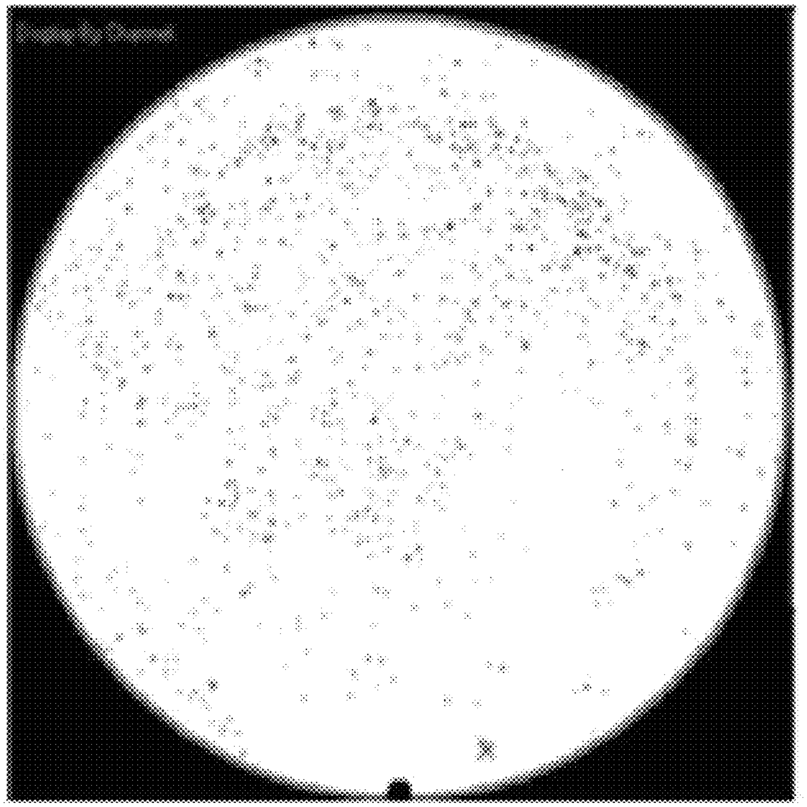
FIG. 2 is a surface defect map (MAP) of a silicon wafer according to Comparative Example 4 of the present disclosure.
Figure 3:
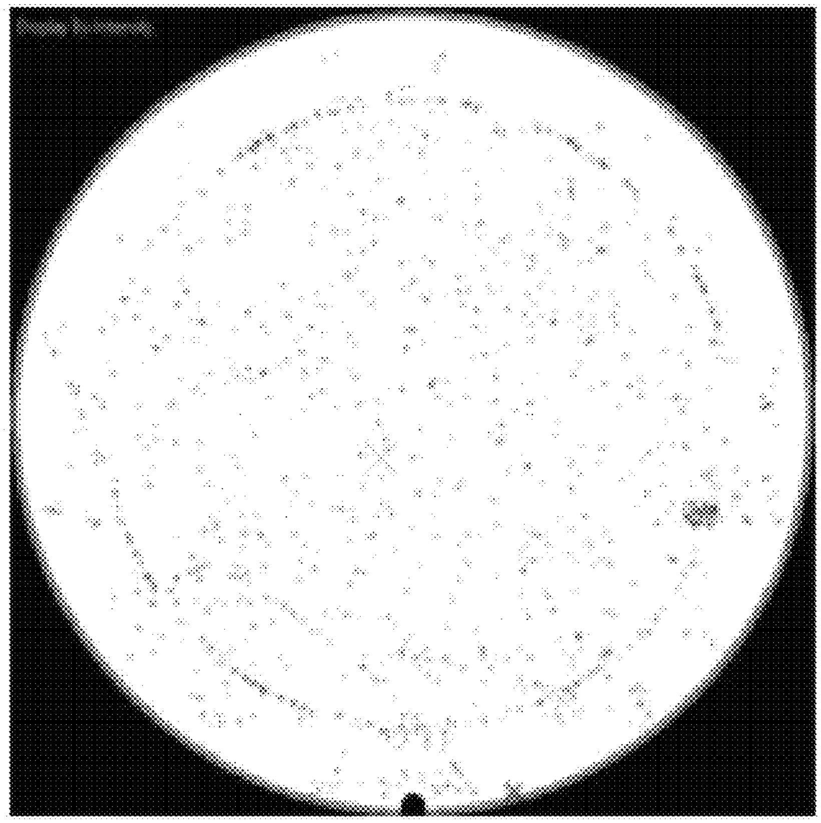
FIG. 3 is a surface defect map (MAP) of a silicon wafer according to Comparative Example 7 of the present disclosure.

Herein after, the present disclosure will be described in more detail. In addition, unless otherwise defined, all terms including technical and scientific terms used herein have the same meaning as commonly understood by those who are ordinarily skilled in the art to which this invention pertains.

In general, the nomenclature used therein is well-known and customary in the art to which the disclosure pertains. Throughout the description of the present disclosure, when a certain component is referred to as "comprising" or "including" an element, it is meant to be inclusive of the element, not exclusive of other components, unless otherwise indicated.

The techniques disclosed herein are applicable to the polishing of silicon substrates. Particularly, the techniques are suitable for polishing silicon wafers. An exemplary silicon wafer referred to herein is a single crystal silicon wafer, for example, a single crystal silicon wafer obtained by slicing a single crystal silicon ingot.

The surface to be polished in the techniques disclosed herein is typically a surface comprising silicon. The polishing methods disclosed herein are preferably applicable to polishing processes on silicon substrates.

A slurry composition for final polishing of silicon wafers, according to the present disclosure, is characterized in that it includes deionized water as a solvent, abrasive particles, a surfactant, a pH adjuster, a water-soluble thickener, a chelating agent, and a polishing accelerator.

The composition is characterized in that, based on the total weight of the composition, the abrasive particles accounts for 1 to 20 wt %, the surfactant accounts for 0.03 to 0.5 wt %, the pH adjuster accounts for 0.1 to 10 wt %, the water-soluble thickener accounts for 0.02 to 2 wt %, the chelating agent accounts for 0.05 to 0.2 wt %, and the polishing accelerator accounts for 0.1 to 1 wt %.

The slurry composition for final polishing of silicon wafers in the embodiment includes water as a solvent. As the water, ionized water (deionized water), pure water, ultrapure water, distilled water, and the like may preferably be used. Preferably, the water used has a total metal ion content of 100 parts per billion (ppb) or less to avoid, as far as possible, inhibiting the action of the other components of the polishing composition.

In the embodiment, the polishing composition includes abrasive particles. The abrasive particles have the function of mechanically polishing the surface of a silicon wafer. As the material of the abrasive particles, colloidal silica, fumed silica, colloidal alumina, fumed alumina, or ceria can be used. In terms of improving the surface smoothness of a silicon wafer, it is preferable to utilize colloidal silica.

The average particle diameter of colloidal silica particles in the slurry composition of the present disclosure is preferably in the range of 30 to 70 nm as measured by dynamic light scattering.

When the average particle diameter of the colloidal silica particles is smaller than 30 nm, the polishing speed is too low to be actually applicable to a polishing process. On the other hand, when the average particle diameter of the colloidal silica particles is larger than 70 nm, a large number of surface defects are generated on the water surface, so that the objective of the present disclosure cannot be accomplished.

In the embodiment, the polishing composition includes a surfactant. The surfactant functions to increase the dispersion stability of the abrasive particles by inducing an increase in the zeta potential between the abrasive particles and by increasing the directionally of the orientation of the polymer used as the thickener.

In particular, the cleaning function of the surfactant increases the ability to prevent the reattachment of siloxane particles that are dislodged during polishing.

Examples of the surfactant include carbonate-based anionic surfactants, sulfonic acid-based anionic surfactants, phosphate-based anionic surfactants, betaine-based amphoteric surfactants, ethylene alone, and non-ionic surfactants in which ethylene and propylene groups have a hydrophilic structure.

Among these surfactants, nonionic surfactants are more preferable in terms of less foaming and ease of pH adjustment.

Specific examples of non-ionic surfactants include homopolymers of oxyalkylenes, block copolymers of multiple types of oxyalkylenes, random copolymers of multiple types of oxyalkylenes, and methacrylate oxyalkylene polymers. These non-ionic surfactants enter between the molecules the water-soluble thickener and are densely adsorbed on the surface of the wafer. In this way, the non-ionic surfactant fills the gaps in a protective film, thereby improving the density or strength of the protective film, and improving the protective effect on the surface of the wafer.

Among these, monofunctional methacrylates with the structure of Formula 2 below are preferred because they have a strong hydrophilicity which increases the protective effect of the wafer surface and reduces the defect count and haze value of the wafer after polishing.

[Formula 2]

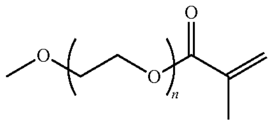

(In Formula 2 above, n is in the range of 7 to 22).

In the present disclosure, ammonium hydroxide in an amount corresponding to 0.1 to 10 wt % of the total weight of the slurry composition is used as the pH adjuster to control the final pH of the slurry composition to fall within the range of 10.5 to 12.0. In addition to its role as a pH adjuster, ammonium hydroxide has the function of forming complexes with metals during the polishing process to suppress metal residue, and this function has the beneficial effect of improving the polishing speed.

In the present disclosure, as the water-soluble thickener that plays a role in causing the slurry to generate a laminar flow to give a desired polishing level while mitigating mechanical abrasive effects, cellulose, polyvinylpyrrolidone, polyvinylpyrrolidone polyacrylic acid copolymers, polyvinylpyrrolidone acetate vinyl copolymers, polyethylene glycol, polyvinyl alcohol, sorbitan monooleate, etc. may be used. Among these water-soluble thickeners, polyvinylpyrrolidone and polyvinyl alcohol are more preferred. Each of these water-soluble thickeners can be used solely or in combination with each other.

In the present disclosure, the slurry composition includes a chelating agent that captures and forms complexes with metal impurities in the abrasive particles, to prevents metal from contaminating silicon wafers. Particularly, the chelating agent inhibits contamination of silicon wafers by nickel or copper.

Examples of the chelating agent include glycine, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatechol, pyromellitic acid, quinic acid, serine, sorbitol, succinic acid, tartaric acid, terephthalic acid, trimellitic acid, trimesic acid, tyrosine, valine, xylitol, salts and derivatives thereof, and combinations thereof.

Of these chelating agents, glycine is particularly preferred. Each of the materials may be used solely, or two or more of the materials may be used in combination.

In the embodiment, the polishing composition typically includes a silicon wafer polishing accelerator. The silicon wafer polishing accelerator is a component that chemically polishes a polishing target surface and contributes to an increase in polishing speed. The silicon wafer polishing accelerator is a compound that chemically etches silicon and is typically an organic basic compound.

The organic basic compound may be a quaternary ammonium salt. The organic basic compound may be one type selected from the group consisting of tetramethylammonium hydroxide, tetraethylammonium hydroxide, choline hydroxide, N,N-dimethylpiperidine hydroxide, and tris(2-hydroxyethyl)methylammonium hydroxide. In addition, these organic bases function as cleaning agents to remove siloxane particles or metal impurities that are dislodged during polishing from the wafer surface. In particular, tris(2-hydroxyethyl)methylammonium hydroxide (THEMAH) having the structure of Formula 1 below is preferred because it has a better cleaning function than other quaternary ammonium salts.

[Formula 1]

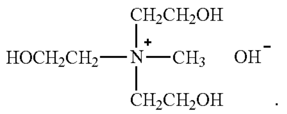

Preferred examples and comparative examples of the present disclosure will be described below. However, these are only preferred embodiments of the present disclosure, and the present disclosure is not limited to these embodiments.

MODE FOR DISCLOSURE

Examples 1 Through 5 and Comparative Examples 1 Through 5

The present disclosure will be described in detail with reference to Examples and Comparative Examples shown in Table 1.

By mixing whetstone particles (abrasive), a surfactant, a pH adjuster, a water-soluble thickener, a chelating agent, a polishing accelerator, and deionized water, polishing compositions shown in Table 1 were obtained.

Specifically, each of the polishing compositions contained 10 wt % of the whetstone particles, 5 wt % of the pH adjuster, 1 wt % of the water-soluble thickener, and 0.1 wt % of the chelating agent with respect to the total weight of the composition, and the type and amount of each of the surfactant and the polishing accelerator were varied as shown in Table 1. In each of the compositions, the balance was deionized water.

TABLE 1

| wt % | Whetstone particle Colloidal Silica | PH adjuster Ammonium hydroxide | Water-Soluble thickener PVA | Chelating agent Glycine | Surfactant PEO-PPO-PEC | | Polishing accelerator TMAH | | |
|---|---|---|---|---|---|---|---|---|---|
| | | | | | PEO-PPO-PEC | PEO methacrylate | TMAH | Choline Hydroxide | THEMAH |
| Exam. 1 | 10 | 5 | 1 | 0.1 | — | 0.03 | —. | —. | 0.5 |
| Exam. 2 | 10 | 5 | 1 | 0.1 | — | 0.2 | —. | —. | 0.5 |
| Exam. 3 | 10 | 5 | 1 | 0.1 | — | 0.5 | —. | —. | 0.5 |
| Exam. 4 | 10 | 5 | 1 | 0.1 | — | 0.03 | —. | —. | 0.1 |
| Exam. 5 | 10 | 5 | 1 | 0.1 | — | 0.03 | —. | —. | 1.0 |
| Comparative Exam. 1 | 10 | 5 | 1 | 0.1 | — | 0.03 | 0.5 | —. | —. |
| Comparative Exam. 2 | 10 | 5 | 1 | 0.1 | | 0.03 | | 0.5 | |
| Comparative Exam. 3 | 10 | 5 | 1 | 0.1 | 0.03 | | 0.5 | | |

TABLE 1-continued

| wt % | Whetstone particle Colloidal Silica | PH adjuster Ammonium hydroxide | Water-Soluble thickener PVA | Chelating agent Glycine | Surfactant PEO-PPO-PEC | Surfactant PEO methacrylate | Polishing accelerator TMAH | Polishing accelerator Choline Hydroxide | Polishing accelerator THEMAH |
|---|---|---|---|---|---|---|---|---|---|
| Comparative Exam. 4 | 10 | 5 | 1 | 0.1 | 0.03 | | | 0.5 | |
| Comparative Exam. 5 | 10 | 5 | 1 | 0.1 | 0.03 | | | | 0.5 |

*PVA: Polyvinyl alcohol

Silicon wafers were polished using the polishing compositions shown in Table 1, and the number of defects and the haze values were measured. The polishing conditions were as follows:

Equipment: 12" 5-zone pressure polisher & cleaner
Pressure: Wafer 1.2 psi (2.5/1.2/1.2/1.2/1.2) R-ring 4.0 psi
PAD: Soft pad (H7000HN-PET)
Dilution ratio: 1:1 dilution
Flow rate: 200 ml/min
Polishing time: 60 seconds
Cleaning solution: SC-1
Brush type: roll type polyvinyl alcohol (PVA)
Cleaning time: 60 seconds Defect measurements were performed using a 10-μm spot size light source (manufactured by KEI Tenkorsase, product name "AIT-XP+"), and haze evaluation was performed using a wafer inspection device (manufactured by KEI Tenkorsase, product name "Surfscan SP2") to measure haze values (ppm) in DWO mode. The measurement results are shown in Table 2 below.

TABLE 2

| | Number of defects (n) | Haze (ppm) |
|---|---|---|
| Example 1 | 636 | 0.143 |
| Example 2 | 671 | 0.140 |
| Example 3 | 710 | 0.137 |
| Example 4 | 791 | 0.145 |
| Example 5 | 578 | 0.141 |
| Comparative Example 1 | 1561 | 0.148 |
| Comparative Example 2 | 1050 | 0.146 |
| Comparative Example 3 | 1967 | 0.151 |
| Comparative Example 4 | 1275 | 0.149 |
| Comparative Example 5 | 923 | 0.147 |

In Example 1 and Comparative Examples 1 and 2, different polishing accelerators were used. THEMAH shows a smaller number of defects and a reduction in haze than TMAH. Comparative Examples 3, 4, and 5 show similar reductions. are seen in Examples 3, 4, and 5. Example 1 and Comparative Example 5 used different surfactants, respectively. Comparative Example 1 and Comparative Example 3 used different surfactants, respectively. Comparative Example 2 and Comparative Example 4 used different surfactants, respectively. The results reveal that the use of PEO-methacrylate as the surfactant show a smaller number of defects and a reduction in haze than the use of PEO-PPO-PEO.

Increasing the surfactant content as in Examples 1, 2, and 3 resulted in decreases in defects and haze, and increasing the polishing accelerator content as in Examples 1, 4, and 5 showed similar decreases. However, the haze reduction tends to be more influenced by the surfactant, and the defect reduction tends to be more influenced by the polishing accelerator.

When the slurry composition of the present disclosure includes a PEO-methacrylate system and an organic base with increased OH groups (THEMAH), defect and haze reductions can be obtained, and thus the efficiency of the polishing process can be increased.

Examples 6 to 11 and Comparative Examples 6 to 9 prepared the polishing compositions by varying the average particle diameter (nm) and content of colloidal silica as shown in Table 3. Specifically, the polishing compositions included 1 to 20 wt % of whetstone particles, 5 wt % of a pH adjuster, 1 wt % of a water-soluble thickener, 0.1 wt % of a chelating agent, 0.03 wt % of PEO-methacrylate, 0.5 wt % of THEMAH, and deionized water as the balance. Then, the polishing speed, defect count, and haze for each of the average particle diameters were measured after polishing, and the results are shown in Table 4.

TABLE 3

| | Average particle size (nm) | Whetstone particle (wt %) | pH adjuster (wt %) | Water-soluble thickeners (wt %) | Chelating agent (wt %) | PEO methacrylate (wt %) | THEMAH (wt %) | Deionized water |
|---|---|---|---|---|---|---|---|---|
| Example 6 | 30 | 5.0 | 5 | 1 | 0.1 | 0.03 | 0.5 | Remainder |
| Example 7 | 40 | 5.0 | 5 | 1 | 0.1 | 0.03 | 0.5 | Remainder |
| Example 8 | 60 | 5.0 | 5 | 1 | 0.1 | 0.03 | 0.5 | Remainder |
| Example 9 | 70 | 5.0 | 5 | 1 | 0.1 | 0.03 | 0.5 | Remainder |
| Example 10 | 40 | 1.0 | 5 | 1 | 0.1 | 0.03 | 0.5 | Remainder |
| Example 11 | 40 | 20.0 | 5 | 1 | 0.1 | 0.03 | 0.5 | Remainder |
| Comparative Exam. 6 | 20 | 5.0 | 5 | 1 | 0.1 | 0.03 | 0.5 | Remainder |

TABLE 3-continued

| | Average particle size (nm) | Whetstone particle (wt %) | pH adjuster (wt %) | Water-soluble thickeners (wt %) | Chelating agent (wt %) | PEO methacrylate (wt %) | THEMAH (wt %) | Deionized water |
|---|---|---|---|---|---|---|---|---|
| Comparative Exam 7 | 80 | 5.0 | 5 | 1 | 0.1 | 0.03 | 0.5 | Remainder |
| Comparative Exam 8 | 80 | 1.0 | 5 | 1 | 0.1 | 0.03 | 0.5 | Remainder |
| Comparative Exam 9 | 80 | 20.0 | 5 | 1 | 0.1 | 0.03 | 0.5 | Remainder |

TABLE 4

| | Polishing speed (nm/min) | Number of defects (n) | Haze (ppm) |
|---|---|---|---|
| Example 6 | 73 | 141 | 0.137 |
| Example 7 | 107 | 353 | 0.138 |
| Example 8 | 166 | 412 | 0.140 |
| Example 9 | 198 | 476 | 0.143 |
| Example 10 | 48 | 129 | 0.136 |
| Example 11 | 204 | 485 | 0.142 |
| Comparative Example 6 | 21 | 115 | 0.135 |
| Comparative Example 7 | 311 | 978 | 0.147 |
| Comparative Example 8 | 149 | 859 | 0.139 |
| Comparative Example 9 | 687 | 1855 | 0.152 |

The results of changing the average particle diameter in Examples 6 to 11 and Comparative Examples 6 and 7 show that smaller particle diameters reduce defects and haze. However, the polishing speed is extremely low when the average particle diameter is 20 nm. Therefore, particle diameters below 30 nm cannot be used in practical processes.

In addition, the average particle diameter of 80 nm had the advantage of increasing the polishing speed and shortening the process time. However, such an average particle diameter has the problem of increasing the number of defects and the haze value, resulting in decrease in the efficiency of the polishing process. Therefore, particle sizes of more than 70 nm cannot be adopted in actual processes.

In Examples 7, 10, 11 and Comparative Examples 7, 8, and 9, the particle content was changed. As a result, the polishing speed, defect count, and haze value tend to decrease as the particle content decreases. Although the defect count and the haze value are reduced, if the polishing speed is far lower than the desired speed, the efficiency of the process is significantly low. Therefore, this condition cannot be adopted in actual processes.

While specific features of the present disclosure have been described in detail above, it will be apparent to the ordinarily skilled in the art that these specific features are merely preferred embodiments and are not intended to limit the scope of the disclosure. Accordingly, the substantial scope of the present disclosure is defined by the appended claims and their equivalents.

The invention claimed is:

1. A slurry composition for final polishing of a silicon wafer for reducing surface defects and haze, the slurry composition comprising:

colloidal silica as abrasive particles;

a surfactant;

a pH adjuster;

a water-soluble thickener;

a chelating agent;

a polishing accelerator; and the balance being water, wherein the slurry composition comprises, based on the total weight:

1 to 20 wt % of the colloidal silica;

0.03 to 0.5 wt % of the surfactant that is PEO-methacrylate having a structure represented by Formula 2;

0.1 to 10 wt % of the pH adjuster;

0.02 to 2 wt % of the water-soluble thickener;

0.05 to 0.2 wt % of the chelating agent;

0.1 to 1 wt % of the polishing accelerator that is an organic base that is tris(2-hydroxyethyl)methylammonium hydroxide (THEMAH) having a structure represented by Formula 1; and the remaining percent by weight of the water,

[Formula 1]

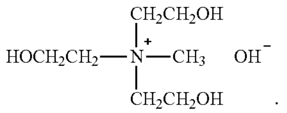

[Formula 2]

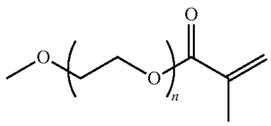

(in Formula 2, n is in a range of 7 to 22).

2. The slurry composition of claim 1, wherein the slurry composition has a pH value of 10.5 to 12.

3. The slurry composition of claim 1, wherein the colloidal silica has a particle size of 30 to 70 nm.

* * * * *